(12) United States Patent
Sontag et al.

(10) Patent No.: US 8,009,783 B2
(45) Date of Patent: Aug. 30, 2011

(54) SYNCHRONOUS DIGITAL DATA TRANSMISSION INTERFACE

(75) Inventors: Yves Sontag, Bordeaux (FR); Laurent Jardin, Saint Jean d'illac (FR)

(73) Assignee: Thales, Neuilly-sur-Seine (FR)

( * ) Notice: Subject to any disclaimer, the term of this patent is extended or adjusted under 35 U.S.C. 154(b) by 636 days.

(21) Appl. No.: 12/158,679

(22) PCT Filed: Dec. 11, 2006

(86) PCT No.: PCT/EP2006/069505
§ 371 (c)(1),
(2), (4) Date: Jun. 20, 2008

(87) PCT Pub. No.: WO2007/071574
PCT Pub. Date: Jun. 28, 2007

(65) Prior Publication Data
US 2008/0267329 A1    Oct. 30, 2008

(30) Foreign Application Priority Data
Dec. 20, 2005 (FR) ...................................... 05 12960

(51) Int. Cl.
*H04L 7/00* (2006.01)
(52) U.S. Cl. ........................................ 375/355; 375/362
(58) Field of Classification Search .................. 375/355, 375/373, 375, 376, 362
See application file for complete search history.

(56) References Cited

U.S. PATENT DOCUMENTS
5,905,769 A     5/1999  Lee et al.
6,271,697 B1 *  8/2001  Hayashi et al. ............... 327/158
2004/0090277 A1*  5/2004  Tsyrganovich ................. 331/74
2005/0134337 A1*  6/2005  Lee et al. ........................ 327/158
2007/0222648 A1   9/2007  Sontag et al.

FOREIGN PATENT DOCUMENTS
EP              0397198 A2    11/1990

OTHER PUBLICATIONS

Widmer A. X. et al.: "Single-Chip 4 X 500-MBD CMOS Transceiver" IEEE Journal of Solid-State Circuits, IEEE Service Center, Piscataway, NJ, US, vol. 31, No. 12, (Dec. 1, 1996), pp. 2004-2013, XP000691821; ISSN: 0018-9200.

* cited by examiner

*Primary Examiner* — Emmanuel Bayard
(74) *Attorney, Agent, or Firm* — Lowe Hauptman Ham & Berner, LLP

(57) ABSTRACT

The field of the invention is that of transmission interfaces for synchronous digital input signals composed of bits transmitted in series at a frequency of transmission equal to a first integer multiple M of a first clock frequency. The interface according to the invention comprises at least one deserializer operating in over-sampling mode and supplying digital output samples of each bit in parallel. The output samples are transmitted at a second clock frequency, integer multiple N of a third frequency. The third frequency is substantially equal to the first frequency. Each sampled bit is substantially composed of N samples. The interface has an electronic device for frequency-locking the third frequency onto the first clock frequency. The device has means for counting the number of samples composing each sampled bit. The device also has incrementation-decrementation means for the third clock frequency configured in such a manner that the third clock frequency is increased when the number of samples is less than the integer multiple N and decreases when the number of samples is greater than N.

4 Claims, 3 Drawing Sheets

SYNCHRONOUS DIGITAL DATA TRANSMISSION INTERFACE

CROSS REFERENCE TO RELATED APPLICATIONS

The present Application is based on International Application No. PCT/EP2006/069505, filed on Dec. 11, 2006, which in turn corresponds to French Application No. 0512960 filed on Dec. 20, 2005, and priority is hereby claimed under 35 USC §119 based on these applications. Each of these applications are hereby incorporated by reference in their entirety into the present application.

FIELD OF THE INVENTION

The field of the invention is that of transmission of synchronous binary digital input signals comprising a deserializer. These interfaces are better known by the acronym SDI for Serial Digital Interface and, more generally, the signals output from these interfaces are called SDI signals.

BACKGROUND OF THE INVENTION

In a large number of applications requiring the processing of digital data at a high bit-rate, the transmission of the data between two processing units takes place via serial links, which allows the cabling to be reduced and the connection system between the various processing units to be simplified. In contrast, the processing of the data is performed in parallel by the processing units for reasons of efficiency.

For parallel-serial and serial-parallel conversions, converters called serializers or deserializers are used, which convert the serial signals into parallel signals and vice versa. In general, the two functions are grouped in a single integrated circuit called a SERDES, an abbreviation for SERializer-DESerializer.

SERDES are used particularly for the transmission of digital video signals. Video signals are governed by definition and transmission standards. The main bodies generating these standards are the CCIR, 'Comité Consultatif International des Radiocommunications', and the SMPTE, Society of Motion Picture Television Engineers.

Certain standards such as the SMPTE 259, which is the serial transmission version of the video standard SMPTE 125, impose the strict compliance with the synchronous nature of the transmission of the video signals. The signals are referred to as synchronous when the frequency of transmission of the signal is an exact multiple of the pixel frequency, which is itself an exact multiple of the line frequency, which is an exact multiple of the frame frequency or field rate. This obligation leads to significant hardware complications for the electronic units having to receive or to transmit such signals such as, for example, switching units. One reason is that the transmission of synchronous signals implies that the clock of the deserializer has a frequency perfectly identical to that of the video signal. In order to resolve this difficulty, there exist two major types of solution.

The first type of solution is illustrated in FIG. 1 that shows an electronic assembly successively comprising 5 main elements:
A first link 101 for transmission of high bit-rate serial digital video signals;
A deserializer 102 conventionally included in a first SERDES component 104 which transforms the serial input signal into parallel signals;
An electronic unit 105 for processing the parallel signals;
A serializer 103 conventionally included in a second SERDES component 104 which transforms the parallel signals into a serial output signal;
A second link 107 for transmission of high bit-rate serial digital video signals.

In this figure and in the following two, the following conventions have been adopted:
The serial signals are represented by black-line arrows;
The parallel signals are represented by wide outline arrows.

In this type of configuration, an analog phase-loop clock recovery circuit is used that is included in the first SERDES component which is only used in receiver mode. It uses a fixed-frequency oscillator as reference clock. Its analog phase-loop clock recovery circuit delivers a clock signal synchronous with the source at the pixel frequency. All the upstream circuits cooperating in the regeneration of an SDI output depending on the input signal then use this clock signal. If this clock possesses too much jitter, an additional phase loop may be inserted that has a very low cutoff frequency and a high quality oscillator of the VCXO type, acronym for Voltage Controlled Crystal Oscillator. This option is illustrated in FIG. 1 where the oscillator 108 is represented by a dashed-line rectangle. The serializer of the first SERDES used in receiver mode cannot be used in transmission mode since its internal clock is not synchronous with the frequency of the input signal. As illustrated in FIG. 1, a second SERDES must therefore be used for the serialization of the serial output signal.

This solution has the drawback of requiring specific SERDES components capable of operating with the "pathological patterns" of the SMPTE 259 standard. "Pathological patterns" is taken to mean any long succession of the same logic state; for example, a succession of 20 "0"s. Said succession is generally called "run length".

The manufacturers of components of the FPGA type, acronym for Field Programmable Gate Array, offer very high bit-rate SERDES components, designed for bit-rates equal to or greater than 622 Mbauds. Their analog phase-loop clock recovery circuits are not compatible with lower bit-rate applications.

At lower bit-rate, the specific SERDES components have the drawbacks of not being able to be integrated into components of the FPGA type and of having a high power consumption and a large space requirement.

The second type of solution is illustrated in FIG. 2 which shows an electronic assembly comprising 5 main elements:
A first link 101 for transmission of high bit-rate serial digital video signals;
A second link for transmission 107 of high bit-rate serial digital video signals;
A single SERDES component 104 comprising:
a deserializer 102 which transforms the serial input signal into parallel input signals and
a serializer 103 which transforms the parallel output signals into a serial output signal;
An electronic processing unit 105 for the parallel signals;
A frame frequency converter 109 also known as a Field Rate Converter.

The principle of operation consists in completely regenerating an SDI video signal by means of a field rate converter 109. This converter uses frame buffers 110 according to modes which can be either "triple page" or FIFO, acronym for "First In-First Out". The circuits upstream of this converter use a clock signal generated in the equipment and all the pixel, line and field frequencies of the output signal are exact divisions of the frequency of this clock signal. Thus, the perfectly synchronous nature of the output signal is complied with. This second solution is costly and complex as regards the hardware. The storage in frame buffers necessarily adds a latency time corresponding to the duration of two frames or two images within the transmission chain. This latency time can prove to be unacceptable when the video information is to be used in real time.

The company ALTERA offers a solution allowing this problem of synchronization of the clock to be solved. This solution is based on the principle of asynchronous over-sampling. The clock for the deserializer is locked onto its reference frequency input instead of being locked onto the frequency of the input signal.

The latter is over-sampled generally with a nominal ratio of 5. For example, if the bit-rate of the input signal is equal to 270 Mbauds, the deserializer operates with a sampling frequency of 1350 Mbauds. The deserialization can be carried out, for example, over 10 bits of the input signal. Consequently, if the over-sampling is in a ratio of 5, for each parallel word of 10 bits, on average 2 samples of the signal are extracted. However, since the reference frequency of the deserializer is produced by an oscillator that is not synchronous, a phase slip will occur that requires either a single sample or three samples to be periodically captured, depending on the sign of frequency difference. The samples are stored in a buffer register from which a word of fixed width is extracted. The rhythm at which the 10 samples are acquired is therefore equal to 27 megahertz. In order to decode the video signal, it just remains to carry out the conventional functions for this type of transmission:

decode the bus according to the pseudo-random code of the standard, an operation called "descrambling";
recognize the video synchronization messages;
recover the phase of the words, an operation called "word boundaries synchronization".

This solution allows a large number of interfaces to be integrated into a single circuit while at the same time conserving a low electrical power consumption, but the frequencies of the input signal are lost. The frequency of the recovered signal is indeed, on average, 27 megahertz. However, with respect to the clock signal of 135 megahertz synchronous with the clock frequency of the deserializer, although the period of the signal is very often equal to the duration of 5 samples, it may occasionally also be equal to 4 or 6 sample times. As a result, the jitter introduced is too large to retransmit a synchronous signal. It is possible to introduce a phase loop in order to filter the frequency of the output signals and restore a perfectly regular clock, but the electronic design of this phase loop proves to be particularly arduous.

The techniques of analog phase loop clock recovery and of over-sampling are usually contradictory; the first is used for high bit-rates, close to the speed limits of the components, and the second is used for low bit-rates.

SUMMARY OF THE INVENTION

The device according to the invention combines deserialization and phase recovery by over-sampling with a frequency-locked loop. It allows synchronous signals to be processed at a lower cost without the drawbacks of the previous methods.

More precisely, the subject of the invention is an interface for transmission of a synchronous digital input signal composed of bits transmitted in series at a frequency of transmission equal to a first integer multiple M of a first clock frequency, said interface comprising at least one deserializer operating in over-sampling mode and supplying digital output samples of each bit in parallel, the output samples being transmitted at a second clock frequency, integer multiple N of a third frequency, said third frequency being substantially equal to the first frequency, each sampled bit being substantially composed of N samples, a serial input signal giving M parallel signals, characterized in that said interface comprises an electronic device for frequency-locking the third frequency onto the first clock frequency, said device comprising:
Means for counting the number of samples composing each sampled bit;
Incrementation-decrementation means for the third clock frequency, configured in such a manner that the third clock frequency is increased when said number of samples is less than the integer multiple N and decreases when said number of samples is greater than N.
Advantageously, the counting means comprise:
Means for detecting changes of state of the digital output samples;
Sample selection means allowing a sample representative of a bit to be extracted from amongst a succession of samples;
Means for comparison of the relative positions of the changes of state of the samples and of the positions of the sample selection means.

Advantageously, the incrementation-decrementation means essentially and successively comprise a digital counter, an analog-digital converter, amplification and filtering electronics, the signal output from said electronics controlling the control voltage of an oscillator that generates the reference clock signal for the deserializer.

Advantageously, the interface is configured in such a manner that the maximum relative frequency difference ΔF/F between the third frequency and the first frequency is less than the inverse of the product of the integer multiple N and the run-length number of the input signal.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

As has been mentioned, the core principles of the invention are three-fold:

Over-sampling of the serial signal;

Determination of the number of samples composing each bit of the signal sampled;

Feedback control of the sampling clock frequency as a function of the number of samples detected.

Figure 1:
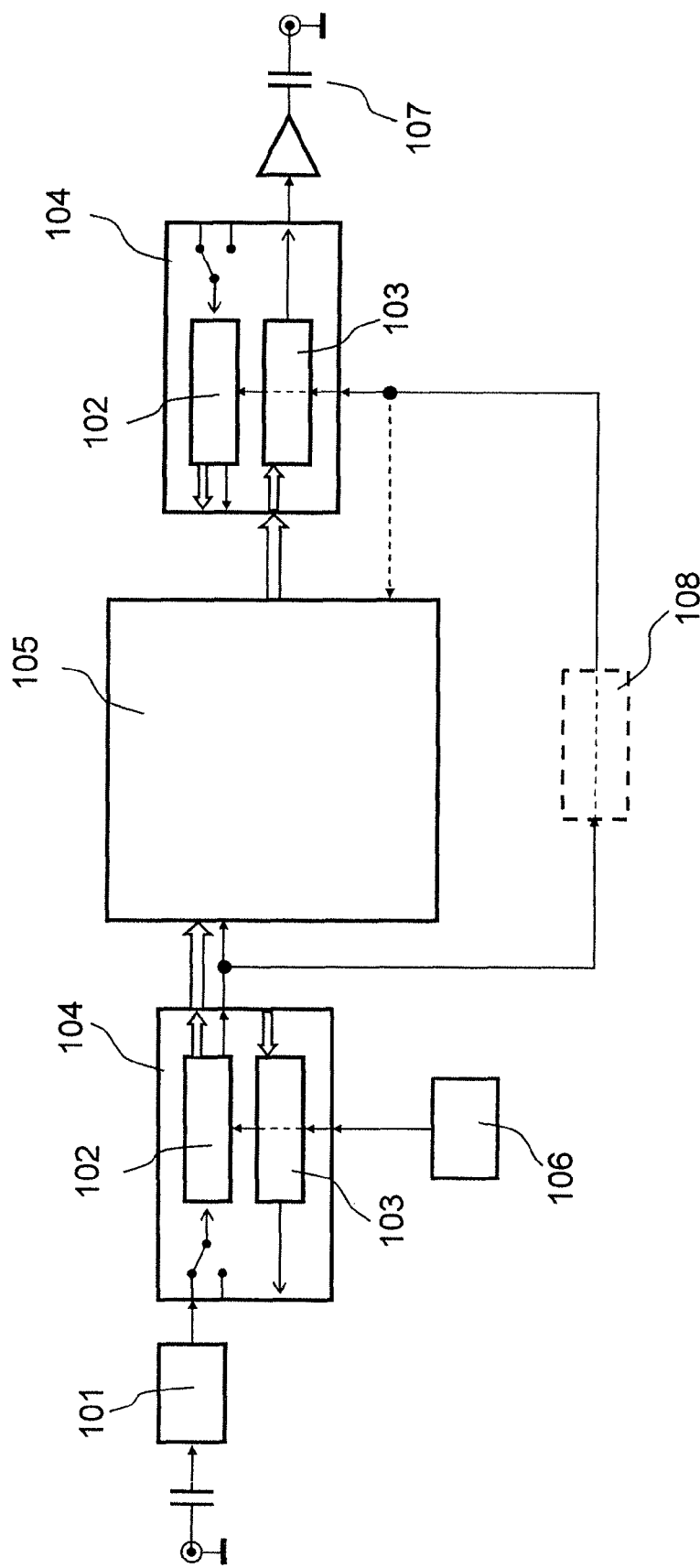
FIG. 1 shows a first electronic assembly according to the prior art allowing the processing of serialized digital signals by a processing unit operating in parallel.
Figure 2:
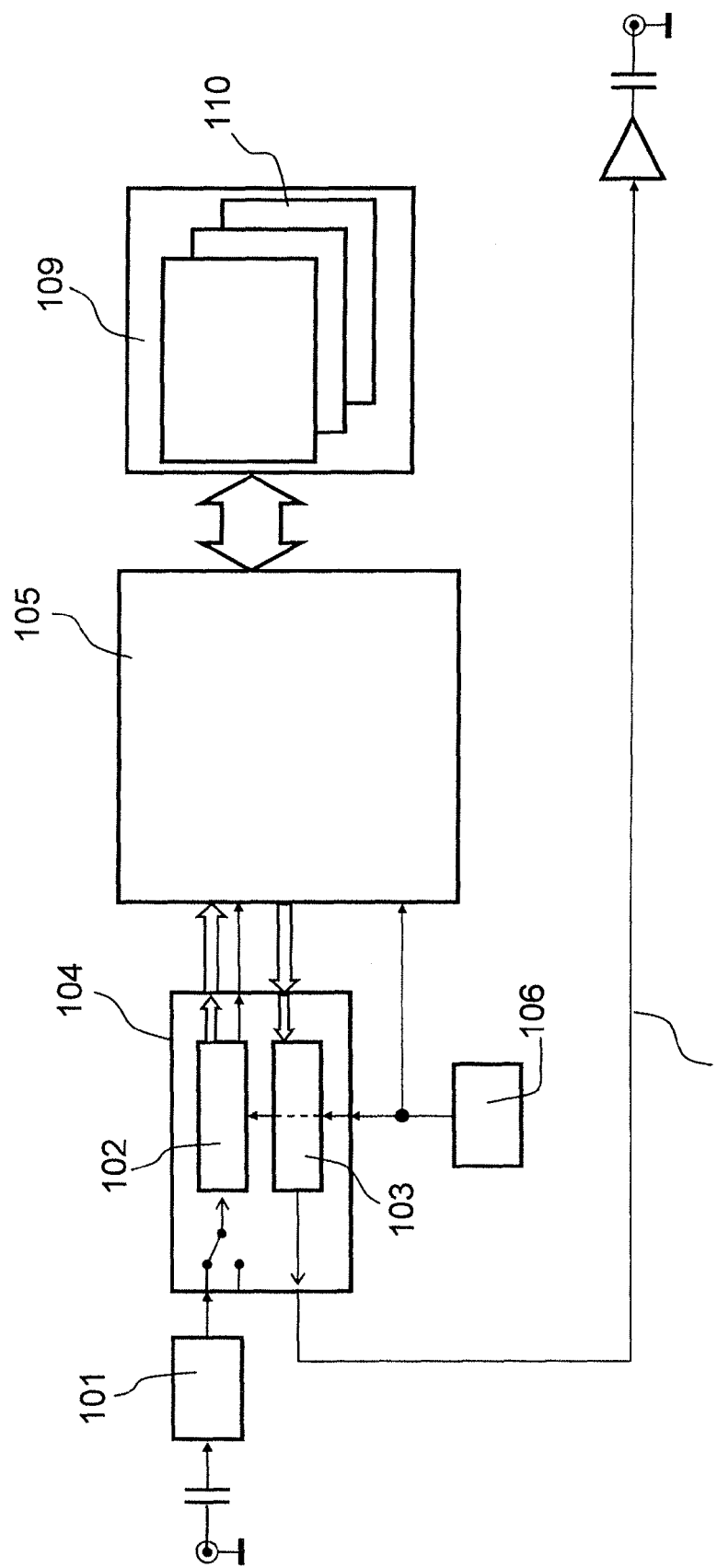
FIG. 2 shows a second electronic assembly according to the prior art also allowing the processing of serialized digital signals by a processing unit operating in parallel.
Figure 3:
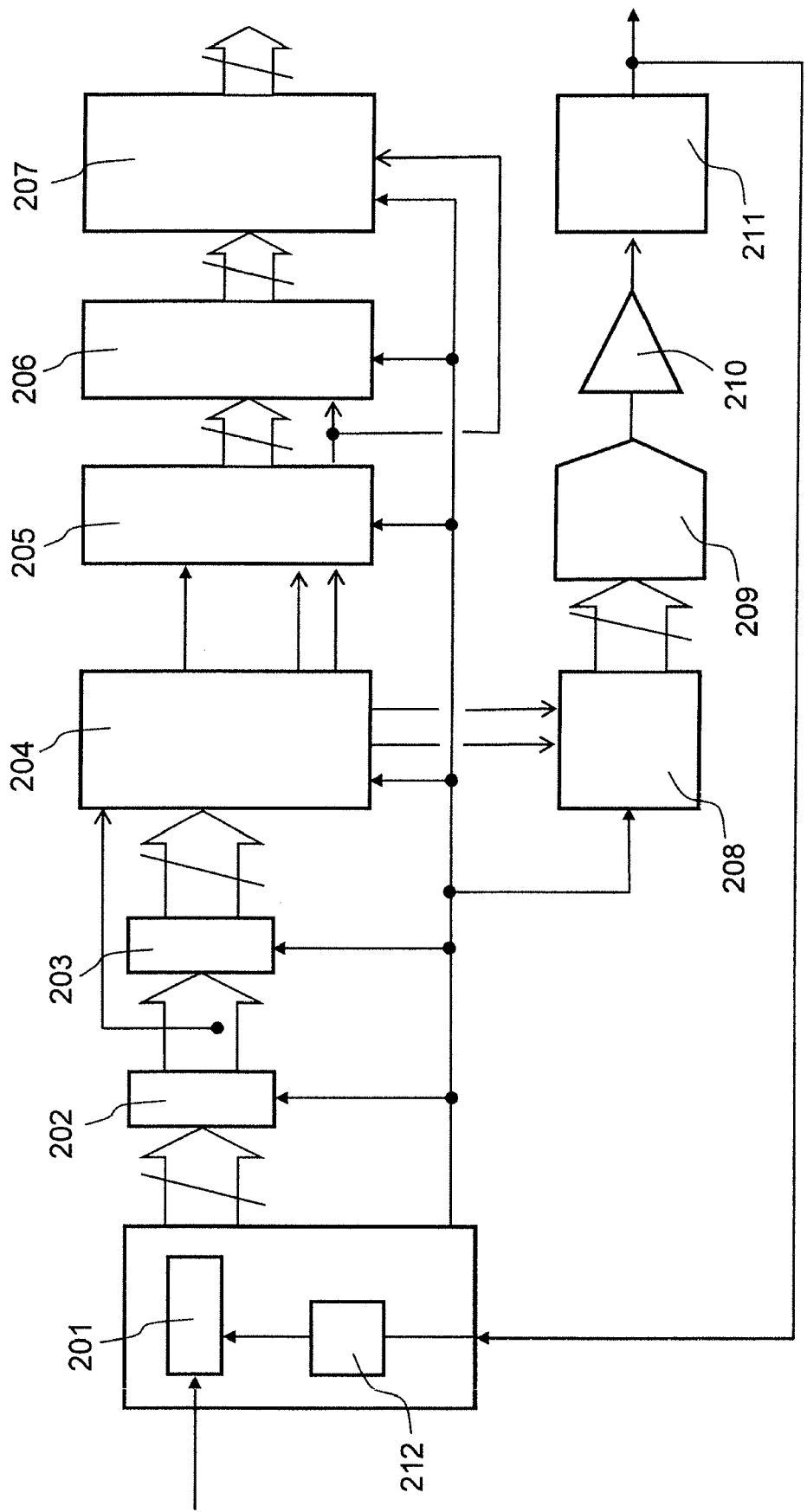
FIG. 3 shows an interface for transmission of a digital input signal according to the invention.

There are of course various electronic designs allowing these functions to be achieved. FIG. 3 is an exemplary block diagram of an interface for transmission of synchronous binary digital input signals according to the invention.

This device comprises:

A deserializer 201;

First and second identical storage registers 202 and 203;

Indexing and comparison means 204;

A third storage register 205;

A fourth storage register 206;

Conventional functions for processing parallel signals 207;

Incrementation-decrementation means for the third clock frequency comprising a counter 208, a digital-analog converter 209, an amplifier 210 and a oscillator 211;

A clock frequency multiplier 212 controlled by the clock signal produced by the oscillator 211.

In order to facilitate the understanding of the operation of the interface, the following values are chosen for the main parameters, which correspond to typical values for video signals:

Pixel frequency of the serialized digital input signal: 270 Mbps (megabits per second);

Over-sampling frequency of the deserializer: substantially equal to 5 times this bit-rate, being around 1350 megahertz. N is therefore equal to 5;

Number M of parallel signals at the output of the deserializer: 10 transmitted at 135 megahertz;

Frequency of the parallel digital output signals: 27 megahertz.

It goes without saying that the device can operate in an equivalent manner with other parameter values.

The serial digital input signal is deserialized by the deserializer 201. At the output of the deserializer 201, streams of 10 parallel samples are transmitted at a rate in the neighborhood of 135 megahertz and are stored in the first register 202.

The second register 203 in FIG. 3 allows at least one eleventh sample following the 10 samples of each stream to be taken into account. This eleventh sample can turn out to be necessary if certain logical operations carried out on the ten samples require two successive samples. This is notably the case when the comparison means 204 comprise logic gates carrying out the "exclusive or" function. In this case, the eleventh sample is useful for performing the logical operation with the tenth sample.

In view of the over-sampling, these 10 parallel signals sampled therefore correspond to around 2 bits of the input signal, each bit being composed of around 5 successive samples.

The indexing and comparison means 204 comprise an electronic pointer which is normally indexed on the central sample of these 5 samples. It is advantageous to adopt this disposition in order to reduce the error rate. Indeed, out of the 5 samples representing one bit of the signal, the end samples can be noisy and a pointing margin of error for a sample is thus conserved.

The indexing and comparison means 204 also comprise means for detecting changes of state of these samples. In order to perform this function, a battery of logic gates carrying out the "exclusive or" function, also denoted XOR, may for example be used. It is known that the output of an XOR gate is at the logic level 1 if one and only one of its two inputs is at the logic level 1. By this means, it is straightforward to determine the changes of state which will result, at the output of the XOR gates, in logic levels "1".

By conventional electronic means, the relative position of the changes of state of the samples and the positions of the pointing means are then compared. Two situations can occur:

The relative position corresponds to the expected position. This means that a sampled bit comprises 5 samples and that, as a result, the sampling frequency is equal to exactly 5 times the frequency of the digital input signal. In this case, neither the position of the pointer nor the sampling frequency are changed and the analysis passes to the following bit. The sample selected by the pointer is stored in the third 12-bit register 205 at the rate of 27 megahertz which fills up as the retained samples arrive.

The relative position does not correspond to the expected position. The variation in phase is due to the frequency slip between the first and the second and third frequencies. This means that a sampled bit does not comprise 5 samples and that, consequently, the sampling frequency is no longer equal to exactly 5 times the frequency of the digital input signal. In this case, three actions are undertaken:

The position of the pointer is indexed either positively or negatively depending on the direction of the phase slip in such a manner as to re-center it on the central sample of a sampled bit.

This indexing signal, which can be positive (UP position) or negative (DOWN position), controls the means for incrementation-decrementation of the clock frequency of the reference signal at 135 megahertz that controls the over-sampling frequency.

The sample selected by the pointer is stored in the third 12-bit register 205.

When the 12-bit register 205 contains at least 10 samples, the 10 older samples are extracted and stored in the fourth register 206 which actually comprises 10 bits in parallel transmitted at the rate of 27 megahertz corresponding to 10 serial bits of the input signal transmitted at the rate of 270 mbps. The deserialization function is therefore really achieved at the right frequency since the sampling clock is constantly locked onto the frequency of the input signal.

It goes without saying that the electronic device may comprise other functions such as the management of the pointer. Indeed, if the pointer always shifts in the same direction over several successive bits, it will necessarily arrive at the limit of the register. In this case, it needs to be reset and verified that, during this reset procedure, the correct number of bits is actually taken into account depending on whether the pointer has descended to the bottom of the register or climbed to the top of the register.

The UP and DOWN signals enable the incrementation or decrementation of a counter 208 whose output produces a analog voltage by means of a digital-analog converter 209, or DAC. Via an amplification and filtering circuit 210, this voltage controls the frequency of the oscillator 211. This frequency is equal to around 135 megahertz. The various electronic components of the system are controlled by this clock frequency. This frequency is multiplied by 10 by a clock frequency multiplier 212. The clock frequency obtained gives the sampling frequency of the deserializer which is therefore equal to 1350 megahertz.

A feedback control of the oscillator 211 onto the first clock frequency of the signal is thus achieved. When the feedback loop is locked, the frequency slip is therefore cancelled.

The transmission interface according to the invention must be capable of operating properly with all types of configurations of serial signals. When a signal presents a succession of several bits at the same logic level, which succession is referred to as "run length", it is important that the sampling frequency be sufficiently close to an integer multiple of the clock frequency of the initial signal so that the period separating two incrementation or decrementation signals is longer than the duration of a run length. Thus, if the duration of a run length is equal to $N_X$ bits and if the relative frequency difference between the clock frequency of the input signal and the clock frequency of the reference signal is denoted as $\Delta F/F$, it can be shown that:

$$\Delta F/F < 1/(N \cdot N_X)$$

For example, in the case of the SMPTE 259 standard, the run length is equal to 20 bits, and if the number of samples is equal to 5, then $\Delta F/F$ must be less than 1%.

The analog-digital converter DAC 209 must possess a sufficient number of coding bits and its coding speed must at least be equal to the sampling frequency multiplied by the relative frequency difference $\Delta F/F$. A video DAC that operates at much higher frequencies may of course be employed.

Any signal produced by a transmission device exhibits a TIE, or Time Interval Error, which corresponds to the difference in position of the transitions of the digital signal with respect to the ideal position. By its very principle, in the device according to the invention, this difference is equal to a sampling period, this being an N-th of the period of the serial signal. Care must be taken that this difference is compatible with the transmission standards retained. In the example mentioned hereinabove, its value is equal to ±0.2 UI and is just compatible with the SMPTE 259 standard. However, this systematic jitter is of very low frequency and has no consequences for the digital video equipment used.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An interface for transmission of a synchronous digital input signal composed of bits transmitted in series at a frequency of transmission equal to a first integer multiple M of a first clock frequency, said interface comprising at least one deserializer operating in over-sampling mode and supplying digital output samples of each bit in parallel, the output samples being transmitted at a second clock frequency, integer multiple N of a third frequency, said third frequency being substantially equal to the first frequency, each sampled bit being substantially composed of N samples, a serial input signal giving M parallel signals, wherein said interface comprises an electronic device for frequency-locking the third frequency onto the first clock frequency, said device comprising:
   means for counting the number of samples composing each sampled bit;
   incrementation-decrementation means for the third clock frequency, configured in such a manner that the third clock frequency is increased when said number of samples is less than the integer multiple N and decreases when said number of samples is greater than N.

2. The transmission interface as claimed in claim 1, wherein the counting means comprise:
   means for detecting changes of state of the digital output samples;
   sample selection means allowing a sample representative of a bit to be extracted from amongst a succession of samples;
   means for comparison of the relative positions of the changes of state of the samples and of the positions of the sample selection means.

3. The transmission interface as claimed in claim 1, wherein the incrementation-decrementation means essentially and successively comprise a digital counter, an analog-digital converter, amplification and filtering electronics, the signal output from said electronics controlling the control voltage of an oscillator that generates the reference clock signal from which the second and the third frequency are produced.

4. The transmission interface as claimed in claim 1, wherein the interface is dimensioned in such a manner that the maximum relative frequency difference $\Delta F/F$ between the third frequency and the first frequency is less than the inverse of the product of the integer multiple N and the run-length number of the input signal.

* * * * *